United States Patent
Blomquist et al.

(10) Patent No.: US 9,477,152 B2
(45) Date of Patent: Oct. 25, 2016

(54) PRINTING FORM PRECURSOR HAVING INDICIA AND A METHOD FOR PREPARING A PRINTING FORM FROM THE PRECURSOR

(71) Applicant: E I DU PONT DE NEMOURS AND COMPANY, Wilmington, DE (US)

(72) Inventors: Robert Blomquist, River Edge, NJ (US); Violeta Lungu, Old Bridge, NJ (US); Adrian Lungu, Old Bridge, NJ (US); Rajgopal Subramanian, Robbinsville, NJ (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/016,323

(22) Filed: Sep. 3, 2013

(65) Prior Publication Data
US 2014/0087306 A1    Mar. 27, 2014

Related U.S. Application Data

(60) Provisional application No. 61/706,175, filed on Sep. 27, 2012.

(51) Int. Cl.
| | |
|---|---|
| *G03F 7/00* | (2006.01) |
| *G03F 7/105* | (2006.01) |
| *G03F 7/30* | (2006.01) |
| *G03F 7/09* | (2006.01) |
| *G03F 7/11* | (2006.01) |
| *B41F 11/02* | (2006.01) |

(52) U.S. Cl.
CPC ............ *G03F 7/105* (2013.01); *G03F 7/00* (2013.01); *G03F 7/0012* (2013.01); *G03F 7/09* (2013.01); *G03F 7/11* (2013.01); *G03F 7/30* (2013.01); *G03F 7/3042* (2013.01); *B41F 11/02* (2013.01)

(58) Field of Classification Search
CPC ............................. G03F 7/202; G03F 7/105
USPC ................................. 430/270.1, 306
See application file for complete search history.

(56) References Cited

U.S. PATENT DOCUMENTS

| | | | |
|---|---|---|---|
| 5,783,364 A | 7/1998 | Ellis et al. | |
| 5,944,881 A | 8/1999 | Mehta et al. | |
| 6,607,267 B2 * | 8/2003 | Testardi | B41J 2/01 235/470 |
| 6,784,761 B2 | 8/2004 | Takeda et al. | |
| 2004/0026921 A1 | 2/2004 | Krone et al. | |
| 2005/0258256 A1 | 11/2005 | Jones et al. | |
| 2005/0281992 A1 * | 12/2005 | Lin | B32B 3/00 428/204 |
| 2006/0154180 A1 | 7/2006 | Kannurpatti | |
| 2006/0188609 A1 | 8/2006 | Jordan et al. | |
| 2007/0269740 A1 * | 11/2007 | Blank | B41M 5/30 430/270.1 |
| 2008/0063980 A1 | 3/2008 | Lungu | |
| 2010/0136483 A1 * | 6/2010 | Lungu | G03F 7/70608 430/270.1 |
| 2011/0175345 A1 | 7/2011 | Xu et al. | |
| 2011/0275017 A1 * | 11/2011 | Tuckwiller et al. | 430/306 |
| 2013/0216955 A1 * | 8/2013 | Schieffer et al. | 430/306 |

* cited by examiner

*Primary Examiner* — Chanceity Robinson
(74) *Attorney, Agent, or Firm* — Simon L. Xu

(57) ABSTRACT

The present invention relates to a photosensitive printing form precursor and a method for forming a printing form from the precursor. The precursor includes a support and a layer of a photosensitive composition adjacent the support, in which at least one indicia is disposed between the support and the photosensitive layer. The indicia identifies the precursor, is retained throughout a multi-step process to convert the precursor into a printing form and in the end-use of the printing form.

20 Claims, 1 Drawing Sheet

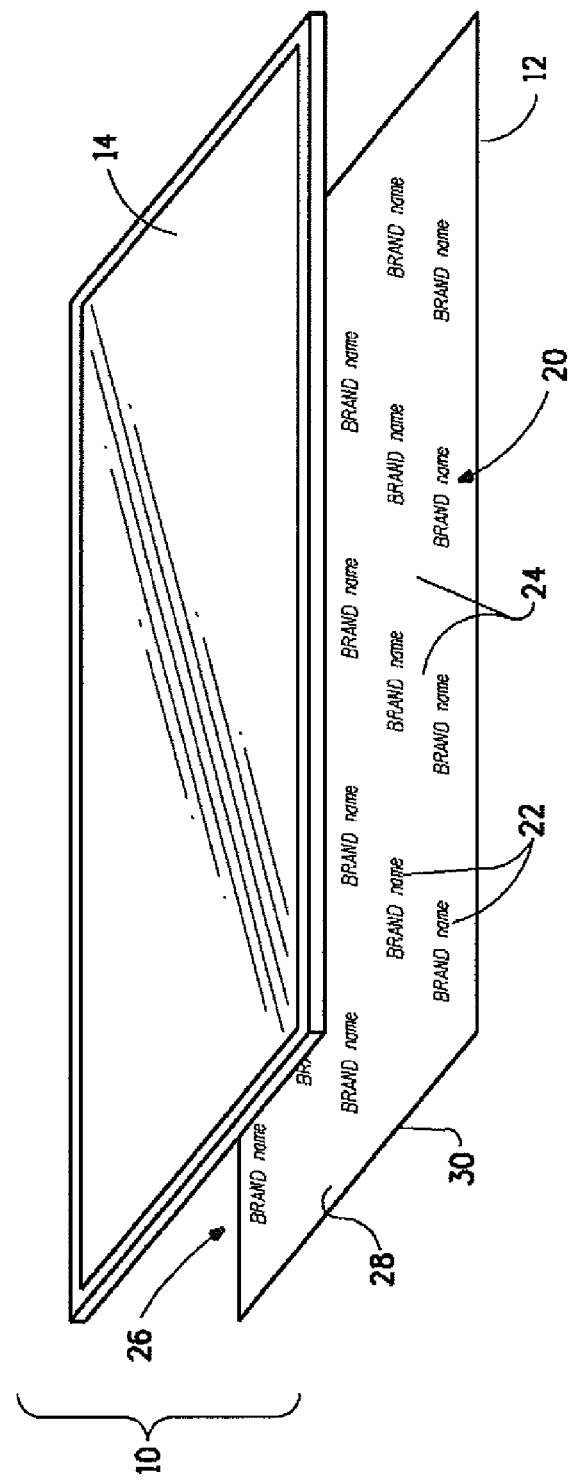

PRINTING FORM PRECURSOR HAVING INDICIA AND A METHOD FOR PREPARING A PRINTING FORM FROM THE PRECURSOR

BACKGROUND OF THE INVENTION

1. Field of the Disclosure

This invention pertains to a printing form precursor and a method for preparing a printing form from the precursor, and particularly a printing form precursor that includes at least one indicia of text or graphic that is present in the printing form.

2. Description of Related Art

Flexographic printing plates are widely used for printing of packaging materials ranging from corrugated carton boxes to card boxes and to continuous web of plastic films. Flexographic printing plates can be prepared from photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a layer of the photopolymerizable composition interposed between a support and a coversheet or a multilayer cover element.

Photopolymerizable elements for flexographic printing are characterized by their ability to crosslink or cure upon exposure to actinic radiation. Photopolymerizable elements undergo a multi-step process and typically involve at least three separate exposures to actinic radiation, to be converted into useful printing forms. In most instances, the actinic radiation is ultraviolet radiation (UV) or visible light. The photosensitive element is uniformly exposed through the backside of the plate to actinic radiation to create a floor or layer of cured photopolymer adjacent the support. Next, an imagewise exposure by actinic radiation of the front-side of the element is made through an image-bearing artwork or a template, such as a photographic negative or transparency (e.g. silver halide film) or through an in-situ mask having radiation opaque areas that had been previously formed above the photopolymerizable layer. The actinic radiation enters the photopolymerizable layer through the clear areas of the transparency and is blocked from entering the black or opaque areas. The exposed material crosslinks and becomes insoluble to solvents used during relief image development. The unexposed photopolymerizable areas under the opaque regions of the transparency are not crosslinked and remain soluble, and are then washed away with a suitable solution, i.e., solvent or aqueous-based, leaving a relief image suitable for printing. Alternatively, a "dry" thermal development process may be used to form the relief image in which the imagewise exposed photosensitive layer is contacted with an absorbent material at a temperature sufficient to cause the composition in the unexposed portions of the photopolymerizable layer to soften or melt and flow into the absorbent material. See U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photopolymerizable layer remain hard, that is, do not soften or melt, at the softening temperature for the unexposed portions. The absorbent material collects the softened un-irradiated material and then is separated and/or removed from the photopolymer layer. The cycle of heating and contacting the photopolymer layer may be repeated several times in order to sufficiently remove the un-irradiated areas and form a relief structure suitable for printing. The printing plate can be further treated to remove surface tackiness. After all desired processing steps, the plate is mounted on a cylinder and used for printing.

A plethora of photopolymerizable elements for flexographic printing exist due to the number of manufacturers as well as the variety of products provided by each of the manufacturers to address particular needs in end-use situations. Manufacturers have included a dye or other coloring agent in the photopolymerizable composition for customers to easily identify and to distinguish their products from other manufacturers' products. Customers have thus associated color of the photopolymerizable element precursor with certain expectations of quality and performance of the resulting printing form.

A problem exists in that counterfeit photopolymerizable print precursors are being made that have the same or similar color as the color of photopolymerizable print precursors having established quality and performance standards in the industry. In the printing industry, printers often use the services of trade shops to prepare printing forms from photopolymerizable elements. Printers often request a particular manufacturer's printing form. But with nothing other than the color as identification of the printing form, counterfeit printing forms can be, and are being, substituted for the printing forms having established quality and performance standards.

From an end user's standpoint, e.g., trade shops and converters, it is desirable to be able to identify the photopolymerizable element should it become separated from its packaging. From the manufacturer's standpoint, when assisting the end-users and/or accepting a returned product, it is desirable to verify that the product is in fact one made by the manufacturer, and not a counterfeit product from another manufacturer. Thus, it is desirable for users to be able to authenticate the identity of the photopolymerizable element, and more importantly for printers to authenticate the identity of the resulting printing form while on press.

Other than color there has been no useful method by which a photopolymerizable element, or its resulting printing form, can be identified, particularly by a printer who has not been directly involved in the printing form preparation. Any identification should survive the multi-step process to convert the photopolymerizable element to a printing form, as well as be sufficiently viewable on the printing form when mounted on a print cylinder of a print press. Also the presence of an identifier on the photopolymerizable element should not influence the properties of the photopolymerizable element, or the creation of the print surface, e.g., relief surface, on the resulting printing form, by the multi-step conversion process to the extent that print characteristics and/or functionality of the printing form are detrimentally impacted. Furthermore in some end-use applications, some printing forms sold in a large size by the manufacturer are cut into smaller sizes by customers, e.g., printers, converters, trade shops, for customized print jobs and for more efficient use of materials. The smaller sized printing forms in some cases are mounted onto carrier sheets that are placed on print cylinders. As such, the size and spacing of the identification should be designed in such a way that the identification is retained with the customized smaller-sized printing forms, and is sufficiently viewable on the when the printing form is mounted onto the carrier sheet.

Currently, one manufacturer marks the coversheet of a photopolymerizable printing precursor with a stripe of repeating textual identification information, by what appears to be dot matrix application. However, the coversheet is removed early in the multi-step conversion process, and as such, the identity of the precursor is not retained through the multi-step conversion process, and not within the resulting printing form. Another manufacturer marks the support of the photopolymerizable printing form, by what appears to be laser etching, with textual product identification information that is approximate and parallel to a side edge of the precursor. The information is so small and close to the side edge that it would typically be captured in the strip that is cut to remove non-imaged edges of the printing form; and, thus would not be present to identify the printing form when mounted on the print cylinder. Even if the information survived edge trimming, this mark would difficult to see once the printing form is mounted onto a print cylinder. Also, in the event that the photopolymerizable element is cut into smaller size printing forms by the customer, the information would not be included on all the smaller size printing forms.

It is not uncommon for manufacturers to mark their goods with identifying marks or brand names as a way to identify and for consumers to distinguish their products from similar goods from other manufacturers. However, the marking of photosensitive printing elements to identify and distinguish the elements sufficiently so that the marking is retained throughout its end-use has been generally avoided because of the difficulties that marking imposes on the conversion of the photosensitive element to the printing form.

Thus, it is desirable to be able to uniquely identify the photopolymerizable element by more than its color so that end-users, e.g., trade shops and printers, can view the identification and be assured of the origin of the resulting printing form. The identification should survive the multi-step process for conversion from the photosensitive element to a printing form, and retain the identification in the resulting printing form.

SUMMARY

In accordance with this invention there is provided a printing form precursor comprising a support; and, a layer of a photopolymerizable material comprising a binder, a monomer, and a photoinitiator, that is adjacent the support and is sensitive to actinic radiation; wherein at least one indicia of a text or graphic is disposed between the support and the photopolymerizable layer.

In accordance with another aspect of this invention there is provided a method for preparing a relief printing form comprising a) providing a printing form precursor comprising a support, and, a layer of a photopolymerizable material comprising a binder, a monomer, and a photoinitiator, that is adjacent the support and is sensitive to actinic radiation, wherein at least one indicia of text or graphic is disposed between the support and the photopolymerizable layer; b) blanket exposing the precursor through the support to actinic radiation to form a floor; c) imagewise exposing the photopolymerizable layer to actinic radiation, creating exposed portions and unexposed portions of the photopolymerizable layer; and d) treating to remove unexposed portions of the photopolymerizable layer and form a relief surface suitable for printing; wherein the indicia is present through steps b) through d).

BRIEF DESCRIPTION OF THE DRAWINGS

The invention can be more fully understood from the following detailed description thereof in connection with the accompanying drawing described as follows:

FIG. 1 is an exploded perspective view of an embodiment of a photosensitive printing precursor having a support, a layer of a photosensitive composition, and one embodiment of at least one indicia disposed between the photosensitive layer and the support.

DESCRIPTION OF THE PREFERRED EMBODIMENTS

Throughout the following detailed description, similar reference characters refer to similar elements in all figures of the drawings.

The present invention concerns photosensitive element, particularly a photopolymerizable printing precursor; a method of using the photosensitive element to form a printing form; and, a method of making the photosensitive element. The photosensitive element includes a composition sensitive to actinic radiation which in most embodiments is a composition that is photopolymerizable. The photosensitive element includes a support, a layer of the photosensitive composition, and at least one indicia that is used to determine the identity of the element as well as the printing form resulting from the method of use. The at least one indicia is text, or graphic, or a combination of both text and graphic, is disposed between the support and the photosensitive layer. The at least one indicia may also be referred to herein as indicia, identifier, mark, and marking. In most embodiments, the at least one indicia has sufficient contrast with the layers of the photosensitive element that the indicia can be easily seen in visible light by a human. The indicia are sufficiently viewable on the photosensitive element as well as the printing form, and particularly when the printing form is mounted on a print cylinder of a printing press.

The presence of the indicia that is generated according to the present invention and disposed between the support and the photosensitive layer does not influence or only minimally influences the properties of the photosensitive element, or the creation of the print surface on the resulting printing form to an extent that print characteristics and/or functionality of the printing form are significantly impacted. It is also surprising that the indicia survive the process to form the photosensitive element, and, the multi-step method to convert the photosensitive element to the printing form.

Unless otherwise indicated, the following terms as used herein have the meaning as defined below.

"Actinic radiation" refers to radiation capable of initiating reaction or reactions to change the physical or chemical characteristics of a photosensitive composition.

"Indicia" refers to distinctive mark or marks that are sufficient to point to or identify a particular photosensitive element and/or printing form. In most embodiments, the indicia visually show the identity of the element or form.

"Lines per inch" (LPI) is a measurement of printing resolution in systems which use a halftone screen. It is a measure of how close together lines in a halftone grid are. Higher LPI generally indicates greater detail and sharpness to an image.

"Halftone" is used for the reproduction of continuous-tone images, by a screening process that converts the image into dots of various sizes and equal spacing between centers. A halftone screen enables the creation of shaded (or grey) areas in images that are printed by transferring (or non-transferring) of a printing medium, such as ink.

"Continuous tone" refers to an image that has a virtually unlimited range of color or shades of grays, that contains unbroken gradient tones having not been screened.

"Dots per inch" (DPI) is a frequency of dot structures in a tonal image, and is a measure of spatial printing dot density, and in particular the number of individual dots that can be placed within the span of one linear inch (2.54 cm). The DPI value tends to correlate with image resolution. Typical DPI range for graphics applications: 75 to 150, but can be as high as 300.

"Line screen resolution", which may sometimes be referred to as "screen ruling" is the number of lines or dots per inch on a halftone screen.

"Optical Density" or simply "Density" is the degree of darkness (light absorption or opacity) of an image, and can be determined from the following relationship:

$$\text{Density} = \log_{10}\{1/\text{reflectance}\}$$

where reflectance is {intensity of reflected light/intensity of incident light}

"Visible radiation or light" refers to a range of electromagnetic radiation that can be detected by the human eye, in which the range of wavelengths of radiation is between about 390 and about 770 nm.

"Infrared radiation or light" refers to wavelengths of radiation between about 770 and $10^6$ nm.

"Ultraviolet radiation or light" refers to wavelengths of radiation between about 10 and 390 nm.

Note that the provided ranges of wavelengths for infrared, visible, and ultraviolet are general guides and that there may be some overlap of radiation wavelengths between what is generally considered ultraviolet radiation and visible radiation, and between what is generally considered visible radiation and infrared radiation.

"White light" refers to light that contains all the wavelengths of visible light at approximately equal intensities, as in sunlight.

"Room light" refers to light that provides general illumination for a room. Room light may or may not contain all the wavelengths of visible light.

"Safelight" refers to a light with a filter, typically a colored filter, that can be used in a room without affecting the photosensitive materials. Generally the safelight illuminates so that photosensitive materials can be handled without premature exposure because the filter blocks out wavelength/s of radiation that causes reaction of the photosensitive material.

The term "photosensitive" encompasses any system in which the photosensitive composition is capable of initiating a reaction or reactions, particularly photochemical reactions, upon response to actinic radiation. Upon exposure to actinic radiation, chain propagated polymerization of a monomer and/or oligomer is induced by either a condensation mechanism or by free radical addition polymerization. While all photopolymerizable mechanisms are contemplated, the compositions and processes of this invention will be described in the context of free-radical initiated addition polymerization of monomers and/or oligomers having one or more terminal ethylenically unsaturated groups. In this context, the photoinitiator system when exposed to actinic radiation can act as a source of free radicals needed to initiate polymerization of the monomer and/or oligomer. The monomer may have non-terminal ethylenically unsaturated groups, and/or the composition may contain one or more other components, such as a binder or oligomer, that promote crosslinking. As such, the term "photopolymerizable" is intended to encompass systems that are photopolymerizable, photocrosslinkable, or both. As used herein, photopolymerization may also be referred to as curing. The photosensitive element may also be referred a photosensitive precursor, photosensitive printing precursor, printing precursor, and precursor.

Unless otherwise indicated, the terms "photosensitive element", "printing precursor" and "printing form" encompass elements or structures in any form suitable as precursors for printing, including, but not limited to, flat sheets, plates, seamless continuous forms, cylindrical forms, plates-on-sleeves, and plates-on-carriers.

Photosensitive Element

FIG. 1 depicts one embodiment of the photosensitive element 10 of the present invention that is a printing form precursor 10 used for preparing printing forms. The printing precursor 10 that includes a support 12, at least one layer of a photosensitive composition 14 that is on or adjacent the support 12, and one embodiment of at least one indicia 20 of text or graphic disposed between the photosensitive layer 14 and the support 12. In most embodiments the photosensitive layer 14 is a layer of a photopolymerizable composition. Though the photopolymerizable layer 14 contacts or is disposed above the support 12, the precursor 10 shown in FIG. 1 is exploded with the photopolymerizable layer 14 separated from the support 12 so the at least one indicia 20 can be seen disposed between the photopolymerizable layer 14 and the support 12. Optionally the photosensitive precursor 10 includes a one or more additional layers and/or coversheet disposed on or above a side of the photopolymerizable layer 14 opposite the support 12, but for simplicity the optional layers and coversheet are not shown in the embodiment of the precursor 10 of FIG. 1. In most embodiments, the printing forms are a relief printing forms that encompass flexographic printing forms and letterpress printing forms. The photosensitive element precursor for printing end-use and the printing form can be of any shape or form including plates and cylinders. The embodiment of the photosensitive printing precursor 10 shown in FIG. 1 is a plate form. Relief printing is a method of printing in which the printing form prints from an image area, where the image area of the printing form is raised and the non-image area is recessed. Relief printing includes flexographic printing and letterpress printing. In some other embodiments, the printing form is suited for gravure or gravure-like printing. Gravure printing is a method of printing in which the printing form prints from an image area, where the image area is depressed and consists of small recessed cups or wells to contain the ink or printing material, and the non-image area is the surface of the form. Gravure-like printing is similar to gravure printing except that a relief printing form is used wherein the image area is depressed and consists of recesses areas forming wells to carry the ink which transfer during printing.

The support 12 can be any flexible material that is conventionally used with photosensitive elements 10 used to prepare printing forms. In most embodiments the support is transparent to actinic radiation to accommodate "backflash" exposure through the support. Examples of suitable support materials include polymeric films such those formed by addition polymers and linear condensation polymers, transparent foams and fabrics. Under certain end-use conditions metals, such as aluminum, may also be used as a support, even though a metal support is not transparent to radiation. Supports of a film composed of a synthetic resin and an antihalation agent as disclosed by Swatton et al. in EP 0 504 824 B1 are also suitable for use in the present invention. The support can be planar for use in a printing form that is plate-shaped, and can be cylindrical for use in a printing form that is a cylinder, often referred to as a printing sleeve.

In one embodiment, the support is a polyester film; and, particularly a polyethylene terephthalate film. In some embodiments, the support itself can include an ultraviolet absorbent material in the film composition and/or the material can included in a layer on the support. Since the presence of the absorbent/s associated with the support in combination with the indicia can influence the penetration of the actinic radiation that is required to alter the physical and/or chemical characteristics of the photosensitive layer, the ultraviolet absorbance of the particular support used should be taken into account when generating suitable indicia for the photosensitive element. In some embodiments, the ultraviolet absorbance of a polyethylene terephthalate film support can be 0.02 to 0.75.

The support may be in sheet form or in cylindrical form, such as a sleeve. The sleeve may be formed from single layer or multiple layers of flexible material. Flexible sleeves made of polymeric films or composite materials are preferred, as they typically are sufficiently transparent to ultraviolet radiation to accommodate backflash exposure for building a floor in the cylindrical printing element. A preferred sleeve is a multiple layered sleeve as disclosed in EP 2460657 A1. The sleeve may also be made of non-transparent, actinic radiation blocking materials, such as nickel or glass epoxy. The support has a thickness that can be from 0.002 to 0.250 inch (0.0051 to 0.635 cm). The support typically has a thickness from 0.002 to 0.050 inch (0.0051 to 0.127 cm). In some embodiments, the thickness for the sheet form is 0.003 to 0.016 inch (0.0076 to 0.040 cm). In some embodiments, the sleeve has a wall thickness from 4 to 80 mils (0.010 to 0.203 cm) or more. In other embodiments, the sleeve has a wall thickness of 10 to 40 mils (0.025 to 0.10 cm).

Optionally, the element includes an adhesive layer between the support 12 and the photopolymerizable layer 14, or a surface of the support that is adjacent the photopolymerizable layer has an adhesion promoting surface. The adhesive layer on the surface of the support can be a subbing layer of an adhesive material or primer or an anchor layer as disclosed in U.S. Pat. Nos. 2,760,863 and 3,036,913 to give suitable adhesion between the support and the photopolymerizable layer. Alternatively, the surface of the support on which the photopolymerizable layer resides can be treated to promote adhesion between the support and the photopolymerizable layer, with flame-treatment or electron-treatment, e.g., corona-treated.

In the present invention, the at least one indicia 20 is disposed between the support 12 and the layer of the photosensitive composition 14. The at least one indicia is text, or graphic, or a combination of text and graphic information that uniquely identifies the photosensitive element, and the resulting printing form. The at least one indicia is not limited and can include, for example, one or more of a manufacturer's name, a trademark, brand name, product name designation, symbols, makers marks, product manufacture code or codes, barcodes, and date/s such as date of manufacture. In the embodiment shown in FIG. 1 the at least one indicia 20 is text of a brand name. In some embodiments, the at least one indicia is the combination of a company name and a brand name for the particular photosensitive element, for example, DuPont™ CYREL®. In other embodiments, the at least one indicia is a company name. In yet other embodiments, the at least one indicia is the combination of a brand name and the particular product designation. In yet other embodiments, the at least one indicia is particular product designation and manufacturing production code information.

In most embodiments, the at least one indicia 20 sufficiently contrasts against the other layers, particularly the photopolymerizable layer 14, of the photosensitive element 10 and the resulting printing form so that the indicia is visible or viewable to the user, without the need for an added or specialized scanning device to detect the indicia. The at least one indicia may be viewable through the photopolymerizable layer and/or through the support. In some embodiments in which the photosensitive element includes an actinic radiation opaque layer for use as an in-situ mask, the indicia may only be viewable from the support side of the element until the in-situ mask is formed, and would be viewable from the support side or the photopolymerizable layer thereafter. In some embodiments, the indicia of the photosensitive element and the resulting printing form is visible to the user, and viewable by automated scanning devices and/or when illuminated with a specialized lighting device. In some other embodiments, the indicia of the photosensitive element and the resulting printing form is only viewable by automated scanning devices and/or when illuminated with a specialized lighting device. In most embodiments the indicia have sufficient contrast with the surrounding layers of the precursor that the indicia are viewable from one or both sides of the photosensitive element as well as the print form. In most embodiments, the at least one indicia is viewable by the user in safelight conditions, and in white light or daylight conditions. In other embodiments, the at least one indicia is viewable by the user in white light, daylight, or room light conditions.

The at least one indicia can be a single image, or multiple images, or a plurality of images, or a repeating pattern of an image, or a repeating pattern of a plurality of images, wherein image encompasses text and/or graphic information. In most embodiments a plurality of images of text and/or graphic information are the indicia that are disposed at the interface between the photopolymerizable layer and the support. The spacing, location on the planar surface of the precursor, size, and style of the least one indicia are not particularly limited. In some embodiments the at least one indicia is spaced to distribute the indicia at intervals over the surface area of the photosensitive element. The intervals need not be regular or evenly spaced. The surface area of a printing precursor or printing form is the planar surface area when shaped as a plate; and is the surface area of the circumference when shaped as a cylinder. In some embodiments, the at least one indicia is created in the manufactured photosensitive element, whether as a repeating pattern or not, such that the at least one indicia or a significant portion of an indicia would be retained or captured in smaller-size plates or segments (i.e., sometimes referred to as slugs) particularly if the photosensitive element or the resulting printing form would be cut into the segments by the end-user. In most embodiments, the at least one indicia is created into a pattern of the text and/or graphic information in which blank areas that have no indicia are interspersed or alternate about the indicia. In most instances of this embodiment, the indicia will repeat in a pattern that alternates with the blank areas that have no indicia, along a length, width, and/or diagonal direction on the surface area of the photosensitive element. In the embodiment shown in FIG. 1, the at least one indicia 20 is a repeating pattern of an image that is text of a brand name 22 in which blank areas (or intervals) 24 that have no indicia are interspersed about the indicia.

In some other embodiments, the indicia 20 can be created into a pattern of text and/or graphic information that continuously repeats (but is discontinuous due to the nature of the text or graphic), and creating a layer-like effect (but not a continuous layer) of the indicia that is superimposed on the entire or substantially entire surface area of the photosensitive element. In another embodiment, the indicia can be created into a pattern of text and/or graphic information that forms a strip that appears substantially continuous of the indicia (but is discontinuous due to the nature of the text or the graphic) that is superimposed as a stripe on a surface area of the photosensitive element. The continuously repeating indicia have no intervals or minimal intervals between adjacent indicia, with open area/s formed within the context of the text and/or graphic information of the indicia itself. The at least one indicia of text or graphic information that continuously repeats or is closely spaced with intervals may have some effect on the transmission of actinic radiation to the photopolymerizable layer which can be compensated to some extent with the backflash exposure to achieve the desired relief. The at least on indicia of text or graphic information that continuously repeats is not intended to be a continuous layer of a material.

Each of the at least one indicia of the multiplicity of indicia has a surface area that summed together is less than the total surface area of the photosensitive element. Expressed as a percentage, the total surface area of the at least one indicia that covers the entire surface area of the photosensitive element is between and optionally includes any two of the following values: 95%, 90%, 85%, 80%, 75%, 70%, 65%, 60%, 55%, 50%, 45%, 40%, 35%, 30%, 25%, 20%, 15%, 10%, 5%, and 3%.

The at least one indicia 20 is disposed between the photopolymerizable layer 14 and the support 12, and located at an interface 26 between the support and the photopolymerizable layer. In most embodiments, the at least one indicia 20 is applied to a surface 28 of the support 12 that is opposite its exterior surface 30 and is (will be) in contact with the layer of the photopolymerizable material 14. In most embodiments, the indicia 20 will be applied to the surface 28 of the support 12 having the adhesive layer (not shown) or the adhesion promoting surface. The indicia can be applied directly or indirectly to the substrate by printing or by ink-jetting an ink. The indicia can be printed by any method including relief printing, such as flexographic printing and letterpress printing; gravure printing; intaglio printing; stencil or screen printing; and lithographic printing. The indicia can be applied to a temporary support and then transferred to the surface 28 of the support 12. The application of the at least one indicia to the substrate can be done online during manufacture of the substrate, or online during manufacture of the photosensitive element, or offline separate from either manufacture process. The at least one indicia is ensconced at the interface between the support and the photopolymerizable layer during process of making the photosensitive element by the manufacturer, which correctly links the identity of the photosensitive element with the manufacturer. With very few exceptions in commercial use, the support remains adjacent the photopolymerizable layer and is retained with the element during conversion to printing form, and thus, the indicia disposed between the support and the photosensitive layer permanently or substantially permanently identifies the element and the resulting printing form. It is contemplated that placing indicia on an exterior surface of the support that is opposite the photopolymerizable layer could result in the loss of the indicia during treating to form the relief surface, particularly when treating with a solvent or solution, and thus not retaining product information through end-use.

It is surprising that the indicia could be printed with an ink onto the adhesive layer or the adhesion-promoting surface of the substrate, and that the integrity of indicia of text and/or graphic information is retained. It is also surprising that the presence of the indicia at the interface of the photopolymerizable layer and the support does not alter or significantly change the adhesion between the support and the photopolymerizable layer, and that there is no apparent migration between ink forming the indicia and the material/s in contact with the indicia, i.e., the photopolymerizable layer and the adhesive layer. Additionally, it is surprising that the at least one indicia retains its integrity as printed or jetted onto the support during manufacture of the photosensitive element in which support contacts molten photopolymerizable material under pressure. The presence of the indicia on the support during assembly of the photosensitive element should be compatible with or at least not interfere with automated quality control methods for detecting defects in the precursor.

The at least one indicia for the precursor is created according to the present invention so that the desire to view or see the text or graphic information is balanced against the functionality of the precursor and printing form. The presence of the at least one indicia between the support and the photosensitive layer may reduce, at least to some degree, the penetration of the actinic radiation that is required to alter the physical and/or chemical characteristics of the photosensitive layer. If the at least one indicia significantly reduces or blocks the actinic radiation from penetrating the composition layer during exposure, the precursor will not achieve the properties desired for end-use as a printing form. The at least one indicia of text or graphic information in the printing form precursor should be transparent or sufficiently transparent to actinic radiation to extent that the functionality of the precursor is not impaired or cannot be compensated for in order for the resulting printing form to be suitable for use.

In some embodiments during manufacture, the photosensitive element is briefly exposed through the support to actinic radiation to (pre)sensitize the photosensitive layer and/or cause the photopolymerizable layer to adhere to the support. A significant reduction or blockage i.e., >50% of the actinic radiation, by the at least one indicia between the support and the photopolymerizable layer could alter the adhesion of the photopolymerizable layer to the support. More importantly, the presence of indicia disposed between the support and the photopolymerizable layer that significantly reduces or blocks actinic radiation will impact the resulting printing form. Photosensitive elements for use as relief printing form undergo a multi-step process that typically involves at least three separate exposures to actinic radiation to be converted to useful printing forms, of which the presence of actinic-radiation-blocking indicia can disrupt at least backflash and the imagewise exposures. The presence of the indicia can have a particular impact to a photopolymerizable element that is uniformly exposed through the backside, i.e., through the support, to actinic radiation to create a floor or layer of cured photopolymer adjacent the support. Indicia that significantly reduces or blocks the penetration of the actinic radiation to the photopolymerizable layer disrupts the formation of the relief surface that includes the floor of the printing form, which manifests as indentation/s to the printing surface and in the floor. If the location of fine raised printing features, that is features of halftone dots of about 1 to about 10%, coincide or overlap with location of indicia that blocks actinic radiation, the indentations or recesses can weaken the fine raised printing features. In most embodiments, the printing form precursor is produced by the manufacturer so that a customer conducts the three separate exposures to actinic radiation, and in particular, so that the customer conducts the backside exposure to create a desired thickness of the floor. In some other embodiments, the printing form precursor is produced by the manufacturer with a conventionally acceptable thickness of floor, which in most instances is created by a through the support or backside exposure of the desired photopolymerizable layer during manufacture. In yet other embodiments, the printing form precursor is produced by the manufacture with a conventionally acceptable floor thickness, which can be created by exposing to actinic radiation through the front side, i.e., surface opposite the support, of a layer of the photopolymerizable material that is formed at the thickness of the desired floor, and then applying another layer of photopolymerizable material to the pre-exposed floor. In this embodiment, because of the front side exposure to form the floor, the indicia is less likely to disrupt the floor and/or relief or printing surface of the print form. This embodiment can be particularly useful for printing forms that are cylindrically-shaped.

The present invention solves these concerns by creating the at least one indicia disposed between the support and photopolymerizable layer in a way that allows for the actinic radiation to sufficiently penetrate to the photopolymerizable layer to convert the photosensitive element to a suitable printing form, while providing a sufficiently viewable and substantially permanent identification or marking of the photosensitive element that remains with the element through its manufacture, conversion into the printing form, and in end-use. For the actinic radiation to sufficiently penetrate through the at least one indicia to the photopolymerizable layer, the indicia should not absorb or substantially absorb actinic radiation. The at least one indicia is transparent or substantially transparent to actinic radiation such that a floor of sufficient thickness for its intended purpose as a printing form can be formed upon exposure with actinic radiation through the support. In some embodiments, the backflash exposure (time, energy) can be adjusted as needed to arrive at the floor thickness desired or recommended for the printing form. For most conventional applications, industry guidelines or manufacturers typically recommend a range for the relief (i.e., depth) suitable for use based upon the thickness of the photopolymerizable layer, from which a range for floor height or thickness is derived. In some embodiments, the floor has a height that is 25% to 90% of the thickness of the photopolymerizable layer. In other embodiments, the floor has a height that is 33% to 85% of the thickness of the photopolymerizable layer. In other embodiments, the floor has a height that is 45% to 85% of the thickness of the photopolymerizable layer. In yet other embodiments, the floor has a height that is 60% to 85% of the thickness of the photopolymerizable layer.

In most embodiments, the at least one indicia is transparent or substantially transparent to actinic radiation such that a floor of sufficient thickness and uniformity for its intended purpose as a printing form can be formed upon exposure with actinic radiation through the support. Factors that influence the functionality of the at least one indicia to be transparent or substantially transparent to actinic radiation and yet be substantially permanent and viewable from manufacture through end-use, include the ink used to print the indicia, the style of the text or graphic information and the structure of text or graphic information that are used to create the indicia on the surface of the substrate.

Ink is a fluid or paste of various colors used for printing (or jetting) that is composed of a pigment or dye in a liquid vehicle. Inks are formulated to meet various requirements that include color, opacity, fade resistance, pliability, odorlessness, drying, and health and environmental safety. In some embodiments inks can include one or more components that absorb actinic radiation, particularly ultraviolet radiation, but inks can be reformulated by those skilled in the art to eliminate or to reduce the absorbance of the radiation. Inks suitable for use in the present invention are not limited. It is within the skill of a person in the art to formulate an ink to accommodate the particular printing method, e.g., relief printing, gravure printing, ink jet, which is used to print the indicia, and to transmit sufficient actinic radiation after printing onto a surface of the support. The ink laid down or applied or printed on the support has a thickness which is dependent upon the particular printing method, the printing conditions, the ink, and the support. The thickness of the ink printed for the at least one indicia is not limited. Acceptable results can occur over a wide range of ink thicknesses. In some embodiments, the ink forming the indicia is formulated so that the indicia can be seen in visible or room light. In some other embodiments, the ink forming the indicia is photoluminescent and can be responsive to radiation other than visible light. In most embodiments, the ink forming the indicia is formulated so that the indicia can be seen in visible or room light, and is not luminescent or photoluminescent in visible or room light.

Since absorbance of an ink is directly proportional to the thickness of the ink laid down and the concentration of the absorbing materials in the ink, the determination of the ability of the ink to transmit actinic radiation is most appropriately determined after ink is applied or printed onto the support by the desired method. In one embodiment, the at least one indicia is generated with an ink that is suitable for printing and transmits at least 1% of the actinic radiation, particularly after the indicia is applied to the support. In another embodiment, the at least one indicia is generated with an ink that is suitable for printing and transmits at least 5% of the actinic radiation, particularly after the indicia is applied to the support. In another embodiment, the at least one indicia is generated with an ink that is suitable for printing and transmits at least 10% of the actinic radiation, particularly after the indicia is applied to the support. In another embodiment, the at least one indicia is generated with an ink that is suitable for printing and transmits at least 15% of the actinic radiation, particularly after the indicia is applied to the support. In yet another embodiment, the at least one indicia is generated with an ink that is suitable for printing and transmits at least 20% of the actinic radiation, particularly after the indicia is applied to the support. The at least one indicia is generated with an ink that transmits actinic radiation that is between, and optionally includes, any two of the following values: 1%, 3%, 5%, 10%, 11%, 12%, 13%, 14%, 15%, 16%, 17%, 18%, 19%, 20%, 25%, 30%, 35%, 40%, 45%, 50%, 55%, 60%, 65%, 70%, 75%, 80%, 85%, 90%, 95%, 98% of the incident actinic radiation to the adjacent photopolymerizable layer.

Color of the ink is not particularly limited. However, the selection of color for the ink may be influenced by the color of the photosensitive element, primarily the color of the photopolymerizable layer, as well as the inherent absorbance of the ink relative to the actinic radiation. In some embodiments, the ink will be a dark color, for example, black, blue, brown, or green colored ink, in order for the indicia to have sufficient contrast with the photosensitive element so that the text and/or graphic information can be easily viewed through end-use when mounted onto a printing cylinder. In most embodiments, the ink is blue since the absorbance of blue inks into the ultraviolet region is typically minimal or tails off into the ultraviolet region of the spectrum. Thus, blue inks are more likely to transmit ultraviolet radiation, which is conventionally the type of actinic radiation used.

The size and the style of the text or graphic information that forms the at least one indicia also influences the penetration of the actinic radiation to the photosensitive layer, and should be balanced against the ability to view the indicia through the conversion process and in end-use. Large or bold characters will block more actinic radiation than small or slender-shaped characters. Images with dense spacing of the text and/or graphic information will block more actinic radiation than images having spacing between and within text characters and/or graphics that are open or non-imaged.

The structure of text or graphic information that forms the indicia can also influence the penetration of the actinic radiation and thereby functionality of the resulting printing form. Text or graphics that are printed with characters or images formed of solid lines will block more actinic radiation than if the characters or images are formed by screening to create and print as halftones. In some embodiments, indicia formed by screening to form halftone images provide suitable balance to the functionality since actinic radiation can penetrate through the indicia to the photosensitive layer, and the indicia can be easily viewed through the conversion process and in end-use. However, at least the size of the dots that form the halftone and the gain in size according to printing method should also be taken into consideration. For instance indicia that is created and printed as a 90% halftone will block more actinic radiation (but will be more viewable) than indicia that is printed as a 10% halftone (but will be less viewable). The text and/or graphic images can be formed to have halftone dot size that is from 1 to 99%, and can be formed to have more than one halftone dot size. Halftones between and optionally includes any of the following values 1%, 3%, 5%, 8%, 10%, 15%, 20%, 25%, 30%, 35%, 40%, 45%, 50%, 55%, 60%, 65%, 70%, 75%, 80%, 85%, 90%, 95%, and 99%.

It should be noted that the sensitivity of the photopolymerizable composition and the thickness of the layer of the photopolymerizable composition can also be expected to affect the functionality of particular indicia for use in the photopolymerizable precursor and the resulting printing form. For instance, the same indicia of text and/or graphic information may be quite suitable and function well in photosensitive elements for some photopolymerizable compositions and/or photopolymerizable layer thicknesses, and yet may be problematic for some other photopolymerizable compositions and/or other photopolymerizable layer thicknesses.

Printing form precursors typically include a floor that is a portion of the photopolymerizable layer that is cured by exposure of the photopolymerizable layer to actinic radiation through the support, i.e., backflash exposure. The at least one indicia in the printing form precursor is sufficiently transparent to actinic radiation if the floor at a location corresponding to indicia has a height that is the same as or substantially the same as a height of the floor at a location that corresponds to having no indicia. In some embodiments, the combination of the pattern and planar coverage on the support, and the ink, style and structure of the of the least one indicia for a particular photopolymerizable composition and layer thickness is such that the indicia can be viewed in the precursor and in the final printing form; and, the indicia is sufficiently transparent to actinic radiation that the print surface and/or floor are not disrupted or disturbed. In some other embodiments, the combination of the pattern and planar coverage on the support, and of the ink, style and structure of the of the least one indicia for a particular photopolymerizable composition and layer thickness is such that the indicia can be viewed in the precursor and in the final printing form; and, the indicia is sufficiently transparent to actinic radiation that the print surface and/or floor is disrupted (e.g., the overall floor height is less than desired), but can be compensated by adjustment to the backflash exposure.

In yet other embodiments, the combination of the pattern and planar coverage on the support, and of the ink, style and structure of the at least one indicia for a particular photopolymerizable composition and layer thickness is such that the indicia can be viewed in the precursor and in the resulting printing form, but the indicia may cause a non-printable defect or depression in the relief surface. This can typically occur in embodiments in which the indicia are spaced to distribute the indicia at intervals over the surface area of the precursor. Since the at least one indicia is disposed between the photopolymerizable layer and the support and is typically present for the backflash exposure through the support to form the floor, indicia that minimally blocks or absorbs actinic radiation (i.e., reduces the transmission) of the actinic radiation to some extent can cause an indentation or recess in the relief surface that may be seen but does not influence printing. In some embodiments, the non-printable defect or depression in the relief surface is most apparent as a slight indentation or recess in the floor of cured photopolymerizable layer (compared to locations of the floor that do not coincide with the indicia). The slight indentation or recess corresponds to, in whole or part, the shape of the indicia. The defect is a non-printable defect or depression when the indentation or recess in the relief surface and floor is insignificant or inconsequential to printing, and thus, the resulting printing form is still capable of providing desired print quality. The transmission of the actinic radiation through the at least one indicia is minimally impeded by the indicia, particularly for the backflash exposure through the support. This results in less crosslinking occurring at locations in the photopolymerizable layer that coincide with the indicia compared to locations in the photopolymerizable layer that do not coincide with the indicia (i.e., in the spaced or open intervals not having indicia), and manifests as the slight recess or indentation in the print surface, particularly the floor, compared to locations that do not coincide with the indicia. In this embodiment, the at least one indicia in the printing form precursor is still considered sufficiently transparent to actinic radiation even though the at least one indicia causes the formation of the nonprintable indentation or recess in the floor and/or relief surface.

For printing forms having a recess or an indentation at a location that coincides with the indicia, the floor has a height (or thickness) that is less than the height (or thickness) of the floor at a location not coinciding with indicia. Height or thickness of the floor (and the relief depth) can be measured with a micrometer. Typically, the sum of the support, the floor height and the relief depth is the thickness of the printing form on press. In most embodiments, the floor height is the sum of the thickness of the cured floor layer of the photopolymer material and the thickness of the support. In other embodiments, the floor height is the thickness of the cured floor layer of the photopolymer material (without the thickness of the support).

Whether the recess or indentation is slight and forms a non-printable defect or depression, or is significant and forms a defect that influences printing is most realistically determined primarily by the end-user (i.e., the printer to meet their customer's print quality requirements) relative to a particular print job. An indentation or recess resulting from the presence of the at least one indicia that is acceptable for one particular print job may be unacceptable for another print job. In addition to the sensitivity of the photopolymerizable composition of the print precursor, factors that can influence the acceptability or unacceptability of an indentation or recess resulting from the presence of the at least one indicia include, but are not limited to: 1) the printing form, particularly the thickness of the printing form on press which is the combination of the thickness of the support and the photopolymerizable layer, and the durometer of the printing form; 2) the desired relief height (i.e., depth of relief) or floor height of the printing form; 3) the complexity of the graphics and/or text to be printed; 4) the substrate being printed e.g., corrugated board or polymeric films. A minimum relief (relief depth) is often recommended for best print quality, performance, tight registration, and less press bounce, but is not always the desired relief height. A minimum relief corresponds to a maximum floor height or thickness.

Even with these factors to consider, a general guideline for acceptable recess or indentation in the relief surface (i.e., a non-printable defect) that is the difference in height of the floor (with support) between location/s with indicia and location/s without indicia is less than about 5% relative to the thickness of the printing form (i.e., total thickness of photopolymer layer/s and support). The difference in height of the floor between location/s with indicia and location/s without indicia is between, and optionally includes, any two of the following values: 5%, 4.75%, 4.5%, 4.25%, 4%, 3.75%, 3.5%, 3.25%, 3%, 2.75%, 2.5%, 2.25%, 2%, 1.75%, 1.5%, 1.25%, 1%, 0.5%, 0. In some embodiments the difference in height of the floor between location/s with indicia and location/s without indicia is less than 5% based on the thickness of the printing form. In most embodiments the difference in height of the floor between location/s with indicia and location/s without indicia is less than 4.5% based on the thickness of the printing form. In some other embodiments the difference in height of the floor between location/s with indicia and location/s without indicia is less than 4% based on the thickness of the printing form. In some other embodiments the difference in height of the floor between location/s with indicia and location/s without indicia is less than 3% based on the thickness of the printing form. Although the difference in floor height is preferably expressed as a percentage as it takes into consideration a wide range of possible thickness for the photopolymerizable layer, in general, an acceptable offset in height of the floor (with or without the support) between location/s without indicia and location/s with indicia that forms the non-printable defect is 0 to about 0.015 inch (0 to about 0.0381 cm). In some embodiments, the offset in height of the floor between location/s without indicia and location/s with indicia that forms the non-printable defect is 0 to about 0.010 inch (0 to about 0.025 cm). In other embodiments the offset in height of the floor between location/s without indicia and location/s with indicia that forms the non-printable defect is 0 to about 0.005 inch (0 to about 0.0127 cm). In other embodiments the offset in height of the floor between location/s without indicia and location/s with indicia that forms the non-printable defect is 0 to about 0.0035 inch (0 to about 0.0089 cm).

The at least one indicia is considered transparent or substantially transparent to actinic radiation if a floor of sufficient thickness (i.e., height) and uniformity for its intended purpose as a printing form can be formed upon exposure with actinic radiation through the support. The floor has a sufficient thickness (i.e., height) and uniformity for its intended purpose when the floor at a location corresponding to indicia has a height that is the same as or substantially the same as a height of the floor at a location that corresponds to having no indicia; and, when slight indentations or recesses are formed in which the difference in height of the floor between location/s with indicia and location/s without indicia is less than about 5% relative to the thickness of the printing form.

In some embodiments, the at least one indicia is printed onto a surface of the support with an ink that transmits at least 10% of incident ultraviolet radiation, and is text or graphic information which is printed as a halftone from 10 to 45% dots. In most embodiments, the at least one indicia is printed onto a surface of the support with a blue ink that transmits at least 15% of incident ultraviolet radiation, and is text or graphic information that is screened to form and print the text as a halftone image. In other embodiments, the at least one indicia is printed onto a surface of the support with a blue ink that transmits at least 10% of incident ultraviolet radiation, and is text or graphic information that is screened to form and print the text as a halftone from 8 to 40% dots. In some other embodiments, the at least one indicia is printed onto the surface of the support with an ink that transmits at least 20% of the incident ultraviolet radiation, and is text or graphic information which is printed as solid line images.

The photopolymerizable layer is a solid layer formed of the composition comprising a binder, at least one ethylenically unsaturated compound, and a photoinitiator. The photoinitiator has sensitivity to actinic radiation. Throughout this specification actinic light will include ultraviolet radiation and/or visible light. The solid layer of the photopolymerizable composition is treated with one or more solutions and/or heat to form a relief suitable for relief printing. As used herein, the term "solid" refers to the physical state of the layer which has a definite volume and shape and resists forces that tend to alter its volume or shape. A solid layer of the photopolymerizable composition may be polymerized (photohardened), or unpolymerized, or both. In some embodiments, the layer of the photopolymerizable composition is elastomeric. In one embodiment, the photosensitive element includes a layer of photopolymerizable composition composed at least of a binder, at least one ethylenically unsaturated compound, and a photoinitiator. In another embodiment, the layer of the photopolymerizable composition includes an elastomeric binder, at least one ethylenically unsaturated compound, and a photoinitiator. In some embodiments, the relief printing form is an elastomeric printing form (i.e., the photopolymerizable layer is an elastomeric layer).

The binder can be a single polymer or mixture of polymers. In some embodiments, the binder is an elastomeric binder. In other embodiments, the layer of the photopolymerizable composition is elastomeric. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. Preferably, the elastomeric block copolymer of an A-B-A type block copolymer, where A represents a non-elastomeric block, preferably a vinyl polymer and most preferably polystyrene, and B represents an elastomeric block, preferably polybutadiene or polyisoprene. In some embodiments, the elastomeric A-B-A block copolymer binders can be poly(styrene/isoprene/styrene) block copolymers, poly(styrene/butadiene/styrene) block copolymers, and combinations thereof. The binder is present in an amount of about 10% to 90% by weight of the photosensitive composition. In some embodiments, the binder is present at about 40% to 85% by weight of the photosensitive composition.

Other suitable binders include acrylics; polyvinyl alcohol; polyvinyl cinnamate; polyamides; epoxies; polyimides; styrenic block copolymers; nitrile rubbers; nitrile elastomers; non-crosslinked polybutadiene; non-crosslinked polyisoprene; polyisobutylene and other butyl elastomers; polyalkyleneoxides; polyphosphazenes; elastomeric polymers and copolymers of acrylates and methacrylate; elastomeric polyurethanes and polyesters; elastomeric polymers and copolymers of olefins such as ethylene-propylene copolymers and non-crosslinked EPDM; elastomeric copolymers of vinyl acetate and its partially hydrogenated derivatives.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Monomers can be appropriately selected by one skilled in the art to provide elastomeric property to the photopolymerizable composition. The at least one compound capable of addition polymerization (i.e., monomer) is present in at least an amount of 5%, typically 10 to 20%, by weight of the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators may be used. Alternatively, the photoinitiator may be a mixture of compounds in which one of the compounds provides the free radicals when caused to do so by a sensitizer activated by radiation. In most embodiments, the photoinitiator for the main exposure (as well as post-exposure and backflash) is sensitive to visible or ultraviolet radiation, between 310 to 400 nm, and preferably 345 to 365 nm. Photoinitiators are generally present in amounts from 0.001% to 10.0% based on the weight of the photopolymerizable composition.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

The thickness of the photopolymerizable layer can vary over a wide range depending upon the type of printing plate desired, for example, from about 0.005 inches to about 0.250 inches or greater (about 0.013 cm to about 0.64 cm or greater). In some embodiments, the photopolymerizable layer has a thickness from about 0.005 inch to 0.0450 inch (0.013 cm to 0.114 cm). In some other embodiments, the photopolymerization layer has a thickness from about 0.020 inches to about 0.112 inches (about 0.05 cm to about 0.28 cm). In other embodiments, the photopolymerizable layer has a thickness from about 0.112 inches to about 0.250 inches or greater (0.28 cm to about 0.64 cm or greater). As is conventional in the art, manufacturers typically identify the printing precursors relative to the total thickness of the printing form on press, which includes the thickness of the support and the photopolymerizable layer. The thickness of the photopolymerizable layer for the printing form is typically less than the manufacturer's designated thickness since the thickness of the support is not included.

It is well within the skill of the practitioner in the art to prepare a photosensitive precursor that includes a layer of the photopolymerizable composition formed by admixing the binder, monomer, initiator, and other ingredients. Since in most embodiments, the at least one indicia is applied to a surface of the support that will be adjacent the photopolymerizable layer, the indicia should withstand and not be disturbed or destroyed by the elevated temperature/s that is typically used to manufacture the photopolymerizable precursor. In most embodiments, the photopolymerizable mixture is formed into a hot melt, extruded, calendered at temperatures above room temperature to the desired thickness between two sheets, such as the support and a temporary coversheet, or between one flat sheet and a release roll. Alternately, the material can be extruded and/or calendered onto a temporary support and later laminated to the desired final support. The element can also be prepared by compounding the components in a suitable mixing device and then pressing the material into the desired shape in a suitable mold. The material is generally pressed between the support and the coversheet. The molding step can involve pressure and/or heat. The coversheet may include one or more of the additional layers which transfer to the photopolymerizable layer when the photosensitive element is formed. Cylindrically shaped photopolymerizable elements may be prepared by any suitable method. In one embodiment, the cylindrically shaped elements can be formed from a photopolymerizable printing plate that is wrapped on a carrier or cylindrical support, i.e., sleeve, and the ends of the plate mated to form the cylinder shape. The cylindrically shaped photopolymerizable element can also be prepared according to the method and apparatus disclosed by Cushner et al. in U.S. Pat. No. 5,798,019. The photosensitive element includes at least one photopolymerizable layer that can be of a bi- or multi-layer construction. Further, the photosensitive element may include an elastomeric capping layer on the at least one photopolymerizable layer. Multilayer cover elements and compositions suitable as the elastomeric capping layer are disclosed in Gruetzmacher et al., U.S. Pat. Nos. 4,427,759 and 4,460,675.

The photosensitive element can include one or more additional layers on or adjacent the photosensitive layer. In most embodiments the one or more additional layers are on a side of the photosensitive layer opposite the support. Examples of additional layers include, but are not limited to, a protective layer, a capping layer, an elastomeric layer, a barrier layer, an actinic radiation opaque layer/s, and combinations thereof. The one or more additional layers can be removable, in whole or in part, during one of the steps to convert the element into a printing form, such as treating. One or more of the additional layers may cover or only partially cover the photosensitive composition layer.

The actinic radiation opaque layer is employed in digital direct-to-plate image technology in which laser radiation, typically infrared laser radiation, is used to form a mask of the image for the photosensitive element (instead of the conventional image transparency or phototool). The actinic radiation opaque layer is substantially opaque to actinic radiation that corresponds with the sensitivity of the photopolymerizable material. Digital methods create a mask image in situ on or disposed above the photopolymerizable layer with laser radiation. Digital methods of creating the mask image require one or more steps to prepare the photosensitive element prior to imagewise exposure. Generally, digital methods of in-situ mask formation either selectively remove or transfer the radiation opaque layer, from or to a surface of the photosensitive element opposite the support. The actinic radiation opaque layer can also be sensitive to laser radiation that can selectively remove or transfer the opaque layer. In one embodiment, the actinic radiation opaque layer is sensitive to infrared laser radiation. The method by which the mask is formed with the radiation opaque layer on the photosensitive element is not limited. Though the in-situ mask formed of the actinic radiation opaque layer typically does contain text and/or graphic information, the in-situ mask is not the same as or similar to the at least one indicia present in the photosensitive precursor. The in-situ mask is formed on or above the photopolymerizable layer opposite the support and thus is not disposed between the support and the photopolymerizable layer. The in-situ mask has opaque areas that block the actinic radiation to form the relief surface, whereas the at least one indicia is composed of text or graphics that transmit or substantially transmit the actinic radiation so as to have no effect or minimal effect on the relief surface.

The photosensitive element can include an actinic radiation opaque layer disposed above a surface of the photopolymerizable layer opposite the support, or can form an assemblage with separate carrier or element that includes the actinic radiation opaque layer. Materials constituting the actinic radiation opaque layer and structures incorporating the actinic radiation opaque layer are not particularly limited, provided that the radiation opaque layer can be imagewise exposed to form the in-situ mask on or adjacent the photopolymerizable layer of the photosensitive element. The actinic radiation opaque layer may substantially cover the surface or only cover an imagable portion of the photopolymerizable layer. The actinic radiation opaque layer is substantially opaque to actinic radiation that corresponds with the sensitivity of the photopolymerizable material. The actinic radiation opaque layer can be used with or without a barrier layer. If used with the barrier layer, the barrier layer is disposed between the photopolymerizable layer and the radiation opaque layer to minimize migration of materials between the photopolymerizable layer and the radiation opaque layer. Monomers and plasticizers can migrate over time if they are compatible with the materials in an adjacent layer, which can alter the laser radiation sensitivity of the radiation opaque layer or can cause smearing and tackifying of the radiation opaque layer after imaging. The actinic radiation opaque layer is also sensitive to laser radiation that can selectively remove or transfer the opaque layer.

In embodiments of the photosensitive element having an actinic radiation opaque layer, it may be difficult to view or observe the at least one indicia of the element from the side of the element having the actinic radiation opaque layer, but the indicia could be viewable from the backside of the element. However, the indicia should be viewable after the in-situ mask is formed on the photosensitive element.

In one embodiment, the actinic radiation opaque layer is sensitive to infrared laser radiation. In some embodiments, the actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers, non-self-oxidizing polymers, thermochemically decomposable polymers, polymers and copolymers of butadiene and isoprene with styrene and/or olefins, pyrolyzable polymers, amphoteric interpolymers, polyethylene wax, materials conventionally used as the release layer described above, and combinations thereof. The thickness of the actinic radiation opaque layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

The photosensitive element may include the actinic radiation opaque layer disposed above and covers or substantially covers the entire surface of the photopolymerizable layer. In this case the infrared laser radiation imagewise removes, i.e., ablates or vaporizes, the radiation opaque layer to form the in-situ mask. Suitable materials and structures for this actinic radiation opaque layer are disclosed by Fan in U.S. Pat. No. 5,262,275; Fan in U.S. Pat. No. 5,719,009; Fan in U.S. Pat. No. 6,558,876; Fan in EP 0 741 330 A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In another embodiment, the photosensitive element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable layer. (If present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable layer. Materials and structures suitable for this actinic radiation opaque layer are disclosed by Fan et al. in U.S. Pat. No. 5,607,814; and Blanchett in U.S. Pat. Nos. 5,766,819; 5,840,463; and EP 0 891 877 A. As a result of the imagewise transfer process, only the transferred portions of the radiation opaque layer will reside on the photosensitive element forming the in-situ mask.

In another embodiment, digital mask formation can be accomplished by imagewise application of the radiation opaque material in the form of inkjet inks on the photosensitive element. Imagewise application of an ink-jet ink can be directly on the photopolymerizable layer or disposed above the photopolymerizable layer on another layer of the photosensitive element. Another contemplated method that digital mask formation can be accomplished is by creating the mask image of the radiation opaque layer on a separate carrier. In some embodiments, the separate carrier includes a radiation opaque layer that is imagewise exposed to laser radiation to selectively remove the radiation opaque material and form the image. The mask image on the carrier is then transferred with application of heat and/or pressure to the surface of the photopolymerizable layer opposite the support. The photopolymerizable layer is typically tacky and will retain the transferred image. The separate carrier may then be removed from the element prior to imagewise exposure.

The photosensitive element may include an elastomeric capping layer on the at least one photopolymerizable layer. The elastomeric capping layer is typically part of a multilayer cover element that becomes part of the photosensitive printing element during calendering of the photopolymerizable layer. Multilayer cover elements and compositions suitable as the elastomeric capping layer are disclosed in Gruetzmacher et al., U.S. Pat. Nos. 4,427,759 and 4,460,675. In some embodiments, the composition of the elastomeric capping layer includes an elastomeric binder, and optionally a monomer and photoinitiator and other additives, all of which can be the same or different than those used in the bulk photopolymerizable layer. Although the elastomeric capping layer may not necessarily contain photoreactive components, the layer ultimately becomes photosensitive when in contact with the underlying bulk photopolymerizable layer. As such, upon imagewise exposure to actinic radiation, the elastomeric capping layer has cured portions in which polymerization or crosslinking have occurred and uncured portions which remain unpolymerized, i.e., uncrosslinked. Treating causes the unpolymerized portions of the elastomeric capping layer to be removed along with the photopolymerizable layer in order to form the relief surface. The elastomeric capping layer that has been exposed to actinic radiation remains on the surface of the polymerized areas of the photopolymerizable layer and becomes the actual printing surface of the printing plate.

For photosensitive elements useful as flexographic printing forms, the surface of the photopolymerizable layer may be tacky and a release layer having a substantially non-tacky surface can be applied to the surface of the photopolymerizable layer. Such release layer can protect the surface of the photopolymerizable layer from being damaged during removal of an optional temporary coversheet and can ensure that the photopolymerizable layer does not stick to the coversheet. During image exposure, the release layer can prevent the image-bearing mask from binding with the photopolymerizable layer. The release layer is insensitive to actinic radiation. The release layer is also suitable as a first embodiment of the barrier layer which is optionally interposed between the photopolymerizable layer and the actinic radiation opaque layer. The elastomeric capping layer may also function as a second embodiment of the barrier layer. Examples of suitable materials for the release layer are well known in the art, and include polyamides, polyvinyl alcohol, hydroxyalkyl cellulose, copolymers of ethylene and vinyl acetate, amphoteric interpolymers, and combinations thereof.

The photosensitive printing element may also include a temporary coversheet on top of the uppermost layer of the element, which is removed prior to preparation of the printing form. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film.

Method of Use

The method for making the printing form includes providing the photosensitive element of the present invention, exposing the photosensitive element to the actinic radiation, and treating the exposed element to form the printing form. In an embodiment in which the photosensitive element forms a printing form, the method for making the printing form comprises the steps of providing the photosensitive element having at least one indicia of text or graphic disposed between the support and the photosensitive layer as described above; imagewise exposing the photosensitive element to actinic radiation to create exposed portions and unexposed portions of the photosensitive layer; and treating the exposed element to remove the unexposed portions to form a surface suitable for printing. In another embodiment in which the photosensitive element forms a relief printing form, the method for making the printing form comprises the steps of providing the photopolymerizable printing precursor having at least one indicia of text or graphic disposed between the support and the photopolymerizable layer as described above; overall exposing the precursor through the support to actinic radiation to form a floor; imagewise exposing the precursor to actinic radiation to create exposed portions (i.e., polymerized portions) and unexposed portions (i.e., unpolymerized portions) of the photopolymerizable layer; and treating the exposed precursor to remove the unexposed portions to form a relief surface suitable for printing.

In order to make the relief printing form, the photosensitive element of the present invention is exposed to actinic radiation from suitable sources. A mercury vapor arc or a sunlamp can be used at a distance of about 1.5 to about 60 inches (about 3.8 to about 153 cm) from the photosensitive printing element. Exposure temperatures are preferably ambient or slightly higher, i.e., about 20° C. to about 35° C. Exposure time can vary from a few seconds to tens of minutes, depending on the intensities and wavelengths of the actinic radiation, the nature and volume of the photopolymerizable layer, the desired image resolution, and the distance from the photosensitive printing element.

For photopolymerizable precursors, the method usually includes a back exposure and a front image-wise exposure. The back exposure or "backflash" can take place before, after, or during image-wise exposure. Backflash prior to image-wise exposure is generally preferred. A backflash is an overall or blanket exposure of actinic radiation through the support of the photopolymerizable precursor, for a time that can range from a few seconds to about 30 minutes. The backflash creates a shallow layer of polymerized material, or a floor, on the support side of the photopolymerizable layer and sensitizes the photopolymerizable layers, helps highlight dot resolution and also establishes the depth of the relief surface for the printing form. The floor improves adhesion of the photopolymerizable layer to the support, and provides better mechanical integrity to the photosensitive element. The floor thickness varies with the time of exposure, exposure source, the thickness of the photopolymerizable layer, etc. In some embodiments, the backflash exposure suitable to establish the floor is conducted during manufacture of the precursor, after the precursor is structurally assembled and includes photopolymerizable layer adjacent the support with the at least one indicia. In most other embodiments, a backflash exposure of minimal time and/or energy is conducted during manufacture of the precursor to assure adhesion of the photopolymerizable layer to the support, and another backflash exposure of a time and/or energy is conducted by the user during conversion from precursor to printing form to establish the floor and depth of the relief. In some embodiments the presence of the at least one indicia between the support and the photopolymerizable layer may have some impact the transmission of actinic radiation to the photopolymerizable layer, and so it may be necessary to compensate by adjusting backflash exposure time and/or energy in order to create the floor with desired height. The adjustment to the backflash exposure may be particularly needed in embodiments in which the indicia continuously repeats, or is closely spaced with intervals, and/or covers more than 50% of the surface area of the precursor.

Imagewise exposure can be carried out by exposing the photosensitive element through an image-bearing mask, which is sometimes referred to as an analog exposure or process. The image-bearing mask, a black and white transparency or negative containing the subject matter to be printed, can be made from silver halide films or other means known in the art. The image-bearing mask is placed on top of the photosensitive element after first stripping off the temporary coversheet. Imagewise exposure can be carried out in a vacuum frame, which provides proper contact of the image-bearing mask and the top surface of the photosensitive printing element, and removes atmospheric oxygen which is known to interfere with the free-radical polymerization process.

Alternatively to the analog process, imagewise exposure can be carried out by exposing the photosensitive element through an actinic radiation opaque mask that is formed digitally usually with laser radiation and resides adjacent or on the photopolymerizable layer. The formation of the mask digitally with laser radiation may be referred to as a digital exposure or process, and the use of a digitally formed mask may be referred to as digital direct-to plate image process. Some suitable direct-to-plate image formation methods are disclosed in U.S. Pat. Nos. 5,262,275; 5,719,009; 5,607,814; van Zoeren, U.S. Pat. No. 5,506,086; and EP 0 741 330 A1. For the digital process, the presence of the infrared-sensitive (and/or radiation opaque) layer is required. An image-bearing mask is formed directly onto the infrared-sensitive layer in situ using an infrared laser exposure engine. Imagewise exposure of printing forms through such digitally formed mask can be done without using a vacuum frame, simplifying the method of making the printing form. In one embodiment, the exposure process involves (1) imagewise ablating the infrared-sensitive layer of the photosensitive printing element described above to form a mask; and (2) overall exposing the photosensitive element to actinic radiation through the mask. The exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred. Alternative methods of forming the mask digitally, i.e., by transfer of actinic radiation opaque mask, or lamination of a digitally formed mask, as well as formation of the mask by ink-jetting are described above for the photosensitive element.

After mask formation digitally or by generating a negative film, the photosensitive element is then exposed to actinic radiation through the mask. On exposure, the transparent areas of the negative or the blank areas of the digital mask allow addition polymerization or crosslinking to take place, while the opaque areas remain uncrosslinked. Imagewise exposing the photopolymerizable element to actinic radiation creates exposed portions that polymerize, and unexposed portions that remain unpolymerized of the photopolymerizable layer. Exposure is of sufficient duration to crosslink the exposed areas down to the support or to the back exposed layer, i.e., floor. Imagewise exposure time is typically much longer than backflash time, and ranges from a few to tens of minutes. Actinic radiation sources encompass the ultraviolet and visible wavelength regions. The suitability of a particular actinic radiation source is governed by the photosensitivity of the initiator and the at least one monomer used in preparing the photosensitive element. The preferred photosensitivity of most common relief printing forms is in the UV and deep visible area of the spectrum, as they afford better room-light stability. Examples of suitable visible and UV sources include carbon arcs, mercury-vapor arcs, fluorescent lamps, electron flash units, electron beam units, lasers, and photographic flood lamps. The most suitable sources of UV radiation are the mercury vapor lamps, particularly the sun lamps. Examples of industry standard radiation sources include the Sylvania 350 Blacklight fluorescent lamp (FR48T12/350 VL/VHO/180, 115 w), and the Philips UV-A "TL"-series low-pressure mercury-vapor fluorescent lamps. These radiation sources generally emit longwave UV radiation between 310-400 nm. Flexographic printing plates sensitive to these particular UV sources use initiators that absorb between 310-400 nm. It is contemplated that the imagewise exposure to infrared radiation for those embodiments which include the infrared-sensitive layer and the overall exposure to actinic radiation can be carried out in the same equipment.

Following overall exposure to UV radiation through the image-bearing mask, the photosensitive printing element is treated to remove unpolymerized areas in the photopolymerizable layer and thereby form a relief image. The treating step is not limited, and includes conventional steps to transform the exposed photosensitive element into the desired printing form. Treating can include treatment with one or more solutions, such as washout or by applying heat, etc. as appropriate for the particular type of photosensitive element that converts the imaged photosensitive layer to a printing form. Treatment of the photosensitive printing element can include (1) "wet" development wherein the photopolymerizable layer is contacted with a suitable developer solution to washout unpolymerized areas and (2) "dry" development wherein the photopolymerizable layer is heated to a development temperature which causes the unpolymerized areas to melt or soften and is contacted with an absorbent material to wick away the unpolymerized material. Dry development may also be called thermal development.

Wet development is usually carried out at about room temperature. The developer solution can include an organic solvent, an aqueous or a semi-aqueous solution, or water. The choice of the developer solution will depend primarily on the chemical nature of the photopolymerizable composition to be removed. A suitable organic solvent developer includes an aromatic or an aliphatic hydrocarbon, an aliphatic or an aromatic halohydrocarbon solvent, or a mixture of such solvents with a suitable alcohol. Other organic solvent developers have been disclosed in published German Application 38 28 551. A suitable semi-aqueous developer can contain water and a water miscible organic solvent and an alkaline material. A suitable aqueous developer can contain water and an alkaline material. Other suitable aqueous developer solution combinations are described in U.S. Pat. No. 3,796,602. Development time can vary, but it is preferably in the range of about 2 to about 25 minutes. The developer solution can be applied in any convenient manner, including immersion, spraying, and brush or roller application. Brushing aids can be used to remove the unpolymerized portions of the photosensitive printing element. Washout can be carried out in an automatic processing unit which uses developer and mechanical brushing action to remove the unexposed portions of the resulting relief printing form, leaving a relief constituting the exposed image and the floor.

Following treatment by developing in solution, the printing forms are generally blotted or wiped dry, and then more fully dried in a forced air or infrared oven. Drying times and temperatures may vary, however, typically the plate can be dried for about 60 minutes to about 120 minutes at about 60° C. High temperatures are not recommended because the support can shrink, and this can cause registration problems.

In thermal development, the photopolymerizable layer can be heated to a development temperature typically between about 40° C. and 200° C. which causes the unpolymerized areas to liquefy, that is, to melt, soften, or flow. The photopolymerizable layer can then be contacted with a development material to remove the unpolymerized photopolymerizable composition. The polymerized areas of the photopolymerizable layer have a higher melting temperature than the unpolymerized areas and therefore do not melt at the development temperatures (see U.S. Pat. No. 5,215,859 and WO 98/13730). Apparatus suitable for thermal development of photosensitive printing elements is disclosed in U.S. Pat. Nos. 5,279,697 and 6,797,454.

In another alternate embodiment the photosensitive element may be suitably reinforced and then imagewise exposed to laser radiation to engrave or remove the reinforced layer in depth imagewise. U.S. Pat. Nos. 5,798,202; 5,804,353; and 6,757,216 B2 disclose suitable processes for making a printing form by laser engraving a reinforced elastomeric layer on a flexible support. The processes disclosed in U.S. Pat. Nos. 5,798,202 and 5,804,353 involve reinforcing and laser engraving a single-layer, or one or more layers of a multi-layer, relief printing precursor comprised of a reinforced elastomeric layer on a flexible support. The elastomeric layer is reinforced mechanically, or thermochemically, or photochemically or combinations thereof. Mechanical reinforcement is provided by incorporating reinforcing agents, such as finely divided particulate material, into the elastomeric layer. Photochemical reinforcement is accomplished by incorporating photohardenable materials into the elastomeric layer and exposing the layer to actinic radiation. Photohardenable materials include photocrosslinkable and photopolymerizable systems having a photoinitiator or photoinitiator system.

The printing forms prepared by the method of the present invention can be uniformly post-exposed to ensure that the photopolymerization process is complete and that the photosensitive printing form will remain stable during printing and storage. This post-exposure step can utilize the same radiation source as the main exposure.

Detackification is an optional post-development treatment which can be applied if the surface of the flexographic printing plate is still tacky, such tackiness not generally being removed in post-exposure. Tackiness can be eliminated by methods well known in the art, such as treatment with bromine or chlorine solutions, and by exposure to radiation sources having a wavelength not longer than 300 nm.

The photosensitive element of the present invention is particularly useful in forming a relief printing form for flexographic printing on surfaces which are soft and easily deformable, such as packaging materials, e.g., cardboard and plastic films. The photosensitive elements of the present invention are converted to printing forms that can be used in the form of plates, plates-on-sleeves, plates-on-carriers, plate segments-on-carriers, or as seamless, continuous flexographic printing forms.

EXAMPLES

In the following examples, all percentages are by weight unless otherwise noted. CYREL® photopolymerizable printing plates, CYREL® Digital Imager, CYREL® exposure unit, and CYREL® processor, are all available from The DuPont Company (Wilmington, Del.).

Example 1

The photosensitive elements used were CYREL® flexographic printing precursors, type HDC (155 mils), which included a support; a layer of a photopolymerizable composition containing an elastomeric binder, monomer, a photoinitiator, a dye, and additives; and a coversheet. Plate size was 52 inch by 80 inch. The support was 5 mil polyethylene terephthalate, type SH18P from SKC Inc. (Covington, Ga., USA), having one side with an adhesive layer. The photopolymerizable layer was pinkish-red color.

Prior to manufacture of the precursor, the support was modified to include a plurality of indicia of graphic information that included company and brand name, e.g., DuPont™ Cyrel®. The indicia were halftone (at 20% dots per inch (dpi)) images, each image of which were ¼ inch high, ½ inch wide, and spaced at about 2 inch staggered intervals on a 45 degree angle. The indicia information was printed onto a surface of the support having the adhesive layer by gravure printing, using a modified blue ink (from Quantum Ink (Louisville, Ky., USA)). The modified blue ink transmitted about 15.5% of ultraviolet radiation versus an off-the-shelf blue ink that transmitted 0.26% of ultraviolet radiation. The photopolymerizable composition was heated, extruded and calendered to form a layer having a thickness about 150 mils between the support and the coversheet. The adhesive side of the support having the indicia information was contacted with the layer of photopolymerizable material. The indicia remained intact as printed, and were not distorted, disturbed, or removed by heat or calendering process to form the precursor. The pattern of indicia substantially covered the support of the precursor, substantially marking the full size of the precursor. The plurality indicia provided sufficient contrast against the color of the photopolymerizable layer and was clearly viewed from the coversheet side of the precursor, i.e., viewed through the coversheet and the thick photopolymerizable layer.

The precursor was exposed on a CYREL® exposure unit 2001E to ultraviolet radiation at 365 nm at 1200 mJoule/cm$^2$ for a backflash exposure, that is an overall exposure through the support, for 42 seconds to form a floor of cured photopolymer adjacent the support. The coversheet was removed from the precursor. A phototool having a mask image was placed on the side of the precursor from which the coversheet was removed, and a vacuum drawn. The mask image contained solid as well as halftone areas, and open areas that will form a floor. The precursor was exposed on the exposure unit to ultraviolet radiation at 365 nm at 1200 mJoule/cm$^2$ for an imagewise exposure through the mask for 16 minutes. The mask image used in the imagewise exposure was the same for all precursors.

The photosensitive precursors were processed in a CYREL® solvent processor 1000P, at the conditions recommended for 155 mil thick plates, using Cylosol solvent (from DuPont) at 30° C. to form a printing plate having a relief surface suitable for flexographic printing. The plate was dried for an hour, and post-exposed for 5 min at 365 nm and finish-exposed for 10 min at 254 nm on a finishing exposure unit. The indicia were not destroyed, distorted, or removed, by the process to prepare the plate from the precursor, and could be viewed from the relief surface of the plate (i.e., through the relief surface of the photopolymer layer).

The relief image of the printing plate was evaluated for floor height (i.e., cured photopolymerizable layer and support) at different locations. The floor height was measured at locations directly above several of the plurality of indicia; and, at locations directly above where there were no indicia (i.e., at intervals between indicia). Several measurements using a microscope were taken at each location, and averaged. Overall, the floor height at indicia locations was about 3 to about 4 mils (about 0.003 to about 0.004 inch; about 0.0076 to about 0.010 cm) less than the floor height at non-indicia locations. In this instance, the presence of the indicia did impede the ultraviolet radiation impinging on the photopolymerizable layer which manifested as indentations in the floor of the plate, but not to a significant degree that the printing capability of the plate was impacted.

It was determined for this particular case that a 155 mil plate having a floor height that had up to about 3.5 mils (0.0035 inch; 0.0089 cm) difference in height from any one floor location to another floor location would be acceptable. The height difference of the floor between indicia locations and non-indicia locations was 2.25% based on the total thickness of the photopolymerizable layer and the support. Since the difference in floor height for the plate produced according to Example 1 was less than or about equal to 3.5 mils, the marking of the support for the precursor with a plurality of indicia as described above was considered acceptable.

The printing plate was mounted onto a print cylinder of a flexographic printing press and used to print on a paper substrate with water-based ink at various impressions. After mounting on the print cylinder, the indicia were still viewable on the plate. The images printed on the substrate were evaluated for the possible transfer of the indicia information, in whole or part, and if the difference in floor height influence print quality. Though the pattern of indicia was noticed as very slight indentations on the floor of the printing plate, the presence of the indicia did not impact the formation of the raised printing surfaces of the plate. The indicia did not transfer dirt or lint or dried ink to the printed images.

Comparative Example

Example 1 was repeated except that the pattern of the plurality of indicia of graphic information that included company and brand name that was printed on the substrate was different. The indicia were halftone (at 50% dpi) images, each of which were 3 inch high, 4 inch wide, and spaced at about 2 inch staggered intervals on a 45 degree angle. The floor height at indicia locations was about 5.5 mils (0.0055 inch) less than the floor height at non-indicia locations. Since the difference in floor height for the 155 mil plate of the Comparative Example is greater than the predetermined limitation of 3.5 mils (0.0035 inch), the marking of the precursor with a plurality of indicia as described for the Comparative was considered unacceptable.

It is expected that dirt or lint or ink could be trapped and collect at one or more locations directly above the indicia where significant indentations (of 5-6 mils) to the floor were formed. This would result in the dirt or lint picking up ink that prints in non-print areas. Further, one would expect that indentations would also impact the formation of the relief surface, such that raised print elements, e.g., fine halftone dots, would not be fully supported by the floor. This would result in chipping, premature wear, and/or loss of the fine raise print elements and/or slight or no contact of the raised print elements in portions of the images or graphics that is printed. While the impact of the indicia on the plate of the Comparative was considered unacceptable, it is contemplated that the same indicia formed in the same pattern could be acceptably used with other photopolymerizable print precursors, or with a precursor having a photopolymerizable layer with greater thickness. It is also contemplated that acceptable results could be attained for the same precursor/printing form of Example 1 that would have the same indicia and pattern, if the indicia was printed with an ink that transmits more ultraviolet radiation.

Example 2

This example demonstrates how to determine whether or not a proposed combination of factors forming the indicia including ink (color and ultraviolet transmission), style and structure of text or graphic information, as well as the pattern and planar coverage will be suitable for use as the indicia for a particular photosensitive precursor and the resulting printing form. In most embodiments since the manufacturer incorporates the indicia into the precursor during production of the precursor, testing based on this example would be conducted by the manufacturer of the print precursor based upon conventionally acceptable standards used in the industry or based upon particular customer end-use of the precursor and printing form.

The photosensitive precursor was CYREL® 155HDC photopolymerizable printing precursor, having a layer of a photopolymerizable composition comprising elastomeric binder, monomers, photoinitiator and other additives. The photopolymerizable layer was about 150 mils thick.

To determine the back exposure necessary to achieve a desired floor height, a standard backflash series was performed on the photosensitive precursor that did not include any indicia or mark between the photopolymerizable layer and the support. The backflash series consisted of blanket or overall exposing the precursor to ultraviolet radiation at 365 nm on a CYREL® exposure unit 2001E with a series of increasing exposure times in sequential areas of the precursor. As the precursor was backflash exposed, the amount of ultraviolet radiation impinging was measured with a radiometer. The precursor was processed in a CYREL® solvent processor 1000P, at the conditions recommended for 155 mil thick plates, using Cylosol solvent (from DuPont) at 30° C. The height of the floor at each area correlating to the exposure time (and exposure energy) was measured. The desired floor height was 0.078 inches. The results of the backflash series are recorded below.

| Exposure time (seconds) | 0 | 10 | 20 | 30 | 40 | 50 | 60 | 70 | 80 |
|---|---|---|---|---|---|---|---|---|---|
| UV radiation (millijoules) | 0 | 154 | 315 | 474 | 632 | 791 | 948 | 1110 | 1271 |
| Floor height (inch) | 0.032 | 0.042 | 0.059 | 0.071 | 0.079 | 0.091 | 0.101 | 0.108 | 0.117 |

The exposure time (and energy) for the desired floor height was determined by extrapolation of the floor height and time (and energy) data from the backflash series. (Alternatively, if one of measured floor heights is the desired floor height, the exposure time (and energy) can be determined directly from the series.) From the exposure series, the exposure time (and energy) needed to obtain a floor height of 0.078 inch was found by extrapolation to be 38.8 seconds.

For the purpose of this Example, it was determined that a maximum difference in floor height of 0.010 inch (from locations that do not coincide with indicia to locations that coincide with the indicia) would be acceptable. The minimally acceptable floor height is determined by subtracting the maximum difference in floor height from the desired floor height. So the minimally acceptable floor height was 0.078−0.010=0.068 inch.

From the backflash exposure series, the floor height values and UV radiation values that surround the desired floor height and the minimally acceptable floor height, a least-squared analysis was done to generate an equation that related the two variables of floor height and UV radiation. From the table above, the UV radiation required for the desired floor height and the minimally acceptable floor height was determined using data between 315 and 632 millijoules (mJ) of exposure. The equation generated from the least-squared analysis of the data, with $r^2$ correlation factor of 0.989, was Floor Height(inch)={UV radiation(mJ)×$6.31 \times 10^{-5}$}+ $3.98 \times 10^{-2}$ The desired floor height was entered into the equation, and the UV radiation needed to provide the desired floor height in a precursor was obtained. Similarly, the minimally acceptable floor height was entered into the equation, and the UV radiation needed to provide a minimally acceptable floor height was obtained. The UV radiation needed to provide a minimally acceptable floor height is the minimally acceptable UV radiation level. Subtraction of the minimally acceptable UV radiation level from the UV radiation level necessary to obtain the desired floor height, obtains a maximum UV radiation difference. The maximum UV radiation difference represents the maximum amount of ultraviolet radiation that could be blocked by indicia without further impact to the floor height beyond the minimally acceptable floor height.

| | |
|---|---|
| UV radiation to obtain desired floor height | 605.7 |
| UV radiation to obtain minimal floor height | 447.3 |
| Maximum UV radiation difference | 158.5 |

Two proposed designs of brand information as the indicia were separately printed using the same ink and press settings onto a polyethylene terephthalate film as a support. One design for the indicia consisted of a brand name printed as solid line text characters. Another design for the indicia consisted of a brand name printed as a halftone image of text characters, which was created with a 20% halftone screen of 150 lines per inch. The ink was the blue ink having at least 15% transmission of the ultraviolet radiation as described in Example 1.

At the back exposure time (38.8 seconds) (energy) to obtain the desired floor height, the amount of UV radiation passing through the support was measured at locations with the proposed brand indicia and at locations without the brand indicia. The brand indicia were measured at one or more areas where it was apparent by eye that the indicia would block the ultraviolet radiation. The amount of UV radiation with the proposed brand indicia was subtracted from the amount of UV without the brand indicia to obtain the difference in UV radiation passing through the brand indicia.

| | Design 1<br>Text of solid lines | Design 2<br>Text as halftone image |
|---|---|---|
| Support without brand indicia | 584 | 584 |
| Support with brand indicia | 246 | 446 |
| Difference | 338 | 138 |

If the difference in UV radiation passing through the brand indicia is greater than the maximum UV Radiation Difference, then the branding image is unacceptable and would need to be altered to reduce its UV absorbance (or increase its transmission of ultraviolet radiation to form the desired floor). Conversely, if the difference in UV radiation passing through the brand indicia is less than the maximum UV Radiation Difference, then the proposed brand indicia is acceptable.

So the proposed brand indicia of design 1 with the text characters composed of solid blue ink resulted in a loss of 338 mJ, which was greater than the maximum UV radiation difference of 158.5 mJ. The support having the brand indicia of design 1 was substituted for the unmarked support to manufacture a 155HDC print precursor. The precursor having design 1 was converted into a printing form as described above in Example 1. The presence of the brand indicia design 1 in the precursor resulted in an unacceptable variation in floor height.

The proposed brand indicia of design 2 with the text characters composed of 20% halftone screen image in blue ink resulted in a loss of 138 mJ, which was less than the maximum UV radiation difference of 158.5 mJ. The support having the brand indicia of design 2 was substituted for the unmarked support to manufacture a 155HDC print precursor. The precursor having design 2 was converted into a printing form as described above in Example 1. The presence of the brand indicia of design 2 resulted in an acceptable variation in floor height for customers.

Example 2 demonstrates one embodiment of a method that can be conducted to determine if particular indicia is acceptable for use with a particular photosensitive element, which can include the following steps that can be performed in the same or different order provided.

1. Determining a Desired Floor Height for the particular photosensitive element. The Desired Floor Height can be done with a series of backflash exposures to the photosensitive element.

2. Determining a Maximum Difference in Floor Height that is acceptable (for the indicia not to influence plate performance). This can be done based upon customer end-use input, experience, or trial-and-error testing of the photosensitive element and/or printing of the printing form resulting from the photosensitive element.
3. Determining a Minimally Acceptable Floor Height by subtracting Maximum Difference in Floor Height (of step 2) from Desired Floor Height (of step 1).
4. Determining Radiation needed for the Desired Floor Height ($R_{dfh}$), and Radiation needed to provide the Minimally Acceptable Floor Height ($R_{mafh}$) (of step 3). The Radiation needed for the Desired Floor Height can be determined by a least-square analysis of the backflash exposure series of step 1, or by additional backflash exposure series.
5. Determining a Maximum Actinic Radiation Difference by subtracting $R_{mafh}$ from $R_{dfh}$ (of step 4). The Maximum Actinic Radiation Difference represents the maximum amount of ultraviolet radiation that could be blocked by indicia without further impact to the floor height beyond the minimally acceptable floor height.
6. Generating one or more proposed indicia on a support for the photosensitive element.
7. Exposing the support with the indicia to actinic radiation at the Radiation needed for the Desired Floor Height ($R_{dfh}$), and measuring the actinic radiation transmitted through the support at locations with proposed indicia and without the proposed indicia.
8. Calculating the Difference in Radiation From Proposed Indicia by subtracting the radiation transmitted at the indicia from the radiation transmitted at a location without indicia (of step 7).
9. Compare the Difference in Radiation From Proposed Indicia (of step 8) with the Maximum Actinic Radiation Difference (of step 5). If the Difference in Radiation From Proposed Indicia is less than the Maximum Actinic Radiation Difference, the proposed indicia is expected to be acceptable and not interfere with printing form performance. If the Difference in Radiation From Proposed Indicia is more than the Maximum Actinic Radiation Difference, the proposed indicia will need to be modified by changing one or more properties (e.g., type of ink, application method, graphic properties, such as halftone dot size, etc.) of the indicia as described above.

It should be understood that the present invention is not limited to the embodiment/s demonstrated herein the Examples for determining the suitability of a particular proposed indicia for particular photosensitive elements. One of ordinary skill can contemplate alternative methods and embodiments for determining the suitability of a particular proposed indicia for particular photosensitive element without departing from the present invention as set forth in the claims. An alternative embodiment for determining suitability of a particular indicia for particular photosensitive elements is by trial-an-error, that is, creating a proposed indicia on the support of a photosensitive element, forming the printing form from the photosensitive element, and testing the printing form by printing to determine visibility and performance of the print form. Based on the present specification, one skilled in the art are capable of determining the steps and methods that can be used to meet specific needs.

Example 3

The photosensitive element used in this example was a CYREL® flexographic printing precursor, type 155HDC, (155 mil thick) which included a support; a layer of a photopolymerizable composition containing an elastomeric binder, monomer, a photoinitiator, a dye, and additives; and a coversheet. Plate size was 30 inch by 40 inch. The support was 5 mil (0.0127 cm) polyethylene terephthalate, type SH18P from SKC Inc. (Covington, Ga., USA), having one side with an adhesive layer. The photopolymerizable layer was pinkish-red color.

Prior to manufacture of the precursor, the support was modified to include a plurality of indicia of graphic information that included company and brand name, i.e., DuPont™ Cyrel®. Each of the plurality of indicia was about 1 inch (2.54 cm) high and 3 inch (7.62 cm) wide. At least one of the indicia was formed as a solid line image, referred to as 100%, and the remainder of the plurality of the indicia were formed as a halftone dot image, referred to by percent dots, as shown in the Table below. The size of the halftone dots (percent dots per inch) used to form halftone dot image was different for each of the indicia, which varied from 93% to 13% dots per inch. The halftone dots were prepared with 175 lines per inch screen ruling. The indicia information was printed onto a surface of the support having the adhesive layer by gravure printing, using a modified blue ink (from Quantum Ink (Louisville, Ky., USA)). The modified blue ink transmitted about 15.5% of ultraviolet radiation versus an off-the-shelf blue ink that transmitted 0.26% of ultraviolet radiation. The photopolymerizable composition was laminated onto the printed support to form a layer having a thickness about 150 mils (0.38 cm) between the support and the coversheet. The adhesive side of the support having the indicia information was contacted with the layer of photopolymerizable material. The indicia provided sufficient contrast against the color of the photopolymerizable layer and was clearly viewed from the coversheet side of the precursor, i.e., viewed through the coversheet and the thick photopolymerizable layer at all dot percentages.

The precursor was exposed on a CYREL® exposure unit 2001E to ultraviolet radiation at 365 nm at 1200 mJoule/cm$^2$ for a backflash exposure, that is an overall exposure through the support, for 40 seconds to form a floor of cured photopolymer adjacent the support. The coversheet was removed from the precursor. No imagewise exposure through a mask was done, but the coversheet was removed.

The photosensitive precursor was processed in a CYREL® solvent processor 1000P, at the conditions recommended for 155 mil thick plates, using Cylosol solvent (from DuPont) at 30° C. to form a floor of a printing plate. No relief surface was formed that would be suitable for flexographic printing. The plate was dried for an hour, and post-exposed for 5 min at 365 nm and finish-exposed for 10 min at 254 nm on a finishing exposure unit. The indicia on the support were not destroyed, distorted, or removed, by the process to prepare the plate from the precursor, and could be viewed from the uppermost surface of the plate (i.e., through the photopolymer layer). The floor of the plate was 54 mil (0.14 cm) thick (including the 5 mil support).

The floor of the printing plate was evaluated for floor height (i.e., cured photopolymerizable layer and support) at different locations. In most instances, the indicia caused a depression in the floor from the exterior surface of the floor. The floor height was measured at the same or substantially the same locations directly above the indicia, at the depression for each of the different indicia. Five measurements using a microscope were taken at each indicia depression location, averaged, and the difference of average value from the floor thickness was reported as Relief Depth in the Table below. The Relief Depth is the depth of the depression formed by the presence of the indicia, and may also be referred to as reverse depth. In some instances, the presence of the indicia did impede the ultraviolet radiation impinging on the photopolymerizable layer which manifested as indentations in the floor of the plate.

TABLE

Example 3

| Indicia Image Formed at Dot Size % | Relief Depth (mm) | Relief Depth (mils) |
|---|---|---|
| 100 (solid line) | 0.507 | 19.9758 |
| 93 | 0.5244 | 20.66136 |
| 87 | 0.502 | 19.7788 |
| 80 | 0.3815 | 15.0311 |
| 73 | 0.3154 | 12.42676 |
| 67 | 0.3031 | 11.94214 |
| 60 | 0.2253 | 8.87682 |
| 53 | 0.2192 | 8.63648 |
| 47 | 0.1598 | 6.29612 |
| 40 | 0.1395 | 5.4963 |
| 33 | 0.0901 | 3.54994 |
| 27 | 0.0676 | 2.66344 |
| 20 | 0.0945 | 3.7233 |
| 13 | 0.0272 | 1.07168 |

It was determined for this particular case that a 155 mil plate having a floor height that had up to about 3.5 mils (0.0089 cm) difference in height from any one floor location to another floor location would be acceptable.

Any of the indicia formed with halftone dots of about 33% or less (33 to 13%) would be acceptable. Though the indicia formed depressions of up to about 3.5 mils (0.09 mm) into the floor, it is expected that the depressions would be a non-printable recess, such that a plate having any these sized indicia would print acceptably. This is based on the determination of the acceptability of a 3.5 mil difference in height, from Example 1. It is expected that different plates (having different photopolymer layer thicknesses and/or formulations) would likely have different cut off in relief depth.

The indicia composed of the 13% halftone dot, formed a ~1 mil (0.0272 mm) depression or recess, is considered representative of indicia that provides substantially no change or impact to the floor, and ultimately to the relief surface of the plate. The indicia composed of the 13% halftone dot was visible throughout the process. Though smaller halftone dot sizes (e.g., from 5 to 12%) could be used to form the indicia, it is expected, at the given indicia characteristics, that the indicia would less likely to form even smaller or no depression into the floor (than the 13% halftone dot), but would be become more difficult to observe. Thus the indicia created for each photosensitive element should be a balance between the functionality of the precursor and printing form, i.e, forms minimal or no depression in the floor or relief surface or printing surface at the indicia locations, against the need for ease in viewing the text or graphic information of the indicia.

What is claimed is:

1. A printing form precursor comprising:
   a) a support; and,
   b) a layer of a photopolymerizable material comprising a binder, a monomer, and a photoinitiator that is sensitive to actinic radiation, the photopolymerizable layer having a front side that is capable of forming a printing surface and a backside that is opposite the front side and adjacent the support;
   wherein at least one indicia of a text or graphic is disposed between the support and the backside of the photopolymerizable layer and
   is visible to a user without the need for an added or specialized scanning device to detect said at least one indicia.

2. The precursor or claim 1 wherein the at least one indicia is transparent to the actinic radiation.

3. The precursor of claim 1 wherein the actinic radiation is ultraviolet radiation and the at least one indicia is created with an ink that transmits at least 1% of the ultraviolet radiation.

4. The precursor of claim 1 wherein the actinic radiation is ultraviolet radiation and the at least one indicia is created with an ink that transmits at least 15% of the ultraviolet radiation.

5. The precursor of claim 1 wherein the actinic radiation is ultraviolet radiation between 10 and 390 nm, and the at least one indicia is created with a blue ink that transmits at least 10% of the actinic radiation.

6. The printing form precursor of claim 1 wherein the at least one indicia is on a surface of the support that contacts the backside of the photopolymerizable layer and transmits at least 5% of the actinic radiation to the photopolymerizable layer.

7. The precursor of claim 1 wherein the at least one indicia is ink-jetted text or graphic, or is printed text or graphic disposed on a surface of the support that is adjacent the backside of the photopolymerizable layer, and the ink-jetted text or graphic or the printed text or graphic is transparent to actinic radiation.

8. The precursor of claim 1 wherein the at least one indicia is selected from a solid line image or a halftone image.

9. The precursor of claim 1 wherein the at least one indicia in the precursor is viewable in visible light or safelight.

10. The precursor of claim 1 wherein the at least one indicia has a color that contrasts with the photopolymerizable layer to be visible.

11. The printing form precursor of claim 1 further comprising a plurality of the at least one indicia forming a pattern.

12. The printing form precursor of claim 1 further comprising a plurality of the at least one indicia forming a pattern, wherein the support has a surface area and the pattern covers 3% to 98% of the surface area.

13. The printing form precursor of claim 1 further comprising an adhesive surface on the support that contacts the backside of the photopolymerizable layer, wherein the at least one indicia is disposed on the adhesive surface.

14. The printing form precursor of claim 1 further comprising a floor that comprises a cured layer portion of the photopolymerizable layer that is between the support and an uncured layer portion of the photopolymerizable layer, wherein the at least one indicia is transparent to the actinic radiation such that the floor has a height and uniformity suitable for relief printing.

15. The printing form precursor of claim 1 wherein the at least one indicia is transparent to the actinic radiation so that exposure to the actinic radiation through the support forms a floor of a cured portion of the photopolymerizable layer.

16. The precursor of claim 1 further comprising a floor that comprises a cured layer portion of the photopolymerizable layer that is exposed to the actinic radiation through the support, wherein the floor has a height h1 at a location that does not have the at least one indicia and a height h2 at a location having the at least one indicia, so that the height h2 equals or is less than 5% of the height h1.

17. The precursor of claim 1 wherein said at least one indicia does not absorb actinic radiation.

18. The precursor of claim 1 wherein said at least one indicia is transparent to actinic radiation.

19. The precursor of claim 1 wherein said at least one indicia is viewable from one or both sides of said photopolymerizable layer.

20. The precursor of claim 1 wherein said at least one indicia is viewable from both sides of said photopolymerizable layer.

\* \* \* \* \*